(12) United States Patent
Li et al.

(10) Patent No.: US 11,163,237 B2
(45) Date of Patent: Nov. 2, 2021

(54) METHOD FOR FIGURE CORRECTION OF OPTICAL ELEMENT BY REACTIVE ION ETCHING

(71) Applicant: The Institute of Optics and Electronics, The Chinese Academy of Sciences, Sichuan (CN)

(72) Inventors: Zhiwei Li, Sichuan (CN); Baiping Lei, Sichuan (CN); Bin Fan, Sichuan (CN); Jiang Bian, Sichuan (CN); Shibin Wu, Sichuan (CN); Junfeng Du, Sichuan (CN)

(73) Assignee: The Institute of Optics and Electronics, The Chinese Academy of Science, Sichuan (CN)

( * ) Notice: Subject to any disclaimer, the term of this patent is extended or adjusted under 35 U.S.C. 154(b) by 0 days.

(21) Appl. No.: 16/906,926

(22) Filed: Jun. 19, 2020

(65) Prior Publication Data
US 2020/0401051 A1    Dec. 24, 2020

(30) Foreign Application Priority Data
Jun. 20, 2019   (CN) .......................... 201910536086.2

(51) Int. Cl.
*G03F 7/20*     (2006.01)
*G03F 7/004*    (2006.01)

(52) U.S. Cl.
CPC ........ *G03F 7/70191* (2013.01); *G03F 7/0041* (2013.01); *G03F 7/70958* (2013.01)

(58) Field of Classification Search
CPC ............. G03F 7/70191; G03F 7/70041; G03F 7/70958

USPC .......................................... 430/5, 20; 355/77
See application file for complete search history.

(56) References Cited

U.S. PATENT DOCUMENTS

| | | | | |
|---|---|---|---|---|
| 2002/0125443 | A1* | 9/2002 | Sandstrom | G03F 7/094 250/492.1 |
| 2011/0014790 | A1* | 1/2011 | Kim | H01L 21/0273 438/689 |
| 2011/0222179 | A1* | 9/2011 | Monadgemi | G02B 1/118 359/850 |

OTHER PUBLICATIONS

Li et al., "Highly accurate positioned, rapid figure correction by reactive ion etching for large aperture lightweight membrane optical elements", vol. 2, No. 12, Dec. 15, 2019 /OSA Continuum pp. 3350-3357.

* cited by examiner

*Primary Examiner* — Hung Nguyen
(74) *Attorney, Agent, or Firm* — Knobbe, Martens, Olson & Bear, LLP

(57) ABSTRACT

A method for figure correction of an optical element includes forming a masking layer on a surface of the optical element. The optical element has thinning regions and non-thinning regions. The masking layer is patterned to form masking regions and non-masking regions, and the masking layer is positioned relative to the optical element in such a manner that the masking regions corresponds to the non-thinning regions of the optical element and the non-masking regions corresponds to the thinning regions of the optical element. The method further includes performing reactive ion etching on the optical element provided with the masking layer so as to etch the thinning regions of the optical element to reduce a thickness of the thinning region.

14 Claims, 6 Drawing Sheets

METHOD FOR FIGURE CORRECTION OF OPTICAL ELEMENT BY REACTIVE ION ETCHING

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The present disclosure relates to the field of ultra-precision surface manufacturing, and particularly relates to a method for figure correction of optical elements by reactive ion etching.

Description of the Related Art

In recent years, with vigorous developments of aerospace industry and rapid progress of social production, the exploration enthusiasm for the space is more and more intense. The aerospace technology makes a great contribution for human to observe the space, the earth and the whole vast universe space. Many countries are beginning to focus on the study of the aerospace technology and space optics. In order to obtain an observation image with high imaging quality and high resolution for a farther target, an improved ground resolution and a larger aperture are the most basic requirement to large space systems such as space telescopes and remote sensing reconnaissance cameras. However, the existing traditional large-aperture telescope is limited by surface mass density of the traditional base material of optics, weight of a reflector is sharply increased with the increase of the aperture and thus a great challenge is brought to the carrying capacity of a rocket. Therefore, the weight of a space optical system is required to be reduced to decrease launching cost. Certain requirements are provided for the material and the manufacturing process of optics of the space optical system.

Membrane optical elements comprise an organic polymer flexible membrane with good space adaptability as its substrate material. The thickness of the substrate may be as low as more than ten microns, and thus the light weight requirement for the optics of the large-aperture space optical system can be completely met. However, the optical manufacturing process of this new substrate material is not mature. The optical processing of the membrane substrate cannot be realized by the traditional processes used for traditional rigid substrate, such as cutting, grinding and various precision polishing techniques. The principle of removing material of a surface of the substrate by the traditional processes, such as bath polishing, magnetorheological polishing, abrasive jet polishing and the like, lie in that an abrasive or a polishing head performs tiny friction and collision on the surface of the substrate material. Due to the certainty of the geometric shape, the brittleness of surface molecules and the reactivity with polishing solution of the rigid substrate of the optics, molecules on the surface of the substrate would be removed from the substrate due to the micro-area chemical reaction generated by the friction, thereby removing the surface material. However, the membrane substrate is flexible in shape and thus would absorb the physical impact which is intended to remove the surface molecules. Furthermore, the membrane substrate has low surface hardness and stable chemical properties due to the fact that molecules are composed of long-chain flexible macromolecules, uncontrollable scratches can be formed by surface friction, and the molecules cannot be removed in a controlled amount. If such a flexible surface is physically rubbed or impacted for a long time, it may cause changes in the optical properties of the membrane material. For example, the light transmittance of the membrane material would be reduced by ion beam polishing for a long time.

In view of the above problems, there is a very urgent need to provide a figure correction method for optical processing a membrane substrate of the optical element. This method can overcome defects caused by the conventional optical processing technology. The molecules on the surface of the substrate of the optical element can be removed gently, and the optical performance of the substrate of the optical element would not be affected.

SUMMARY OF THE INVENTION

In order to solve the above technical problems, the present disclosure provides a method for figure correction of optical element by reactive ion etching, which can quickly and efficiently correct the figure of a flexible membrane without influencing the optical performance of the membrane. The method can accurately control the boundary lines between the thinning regions and the non-thinning regions, with high alignment precision, less iteration times and high control precision of the thinning depth. Through the method of the present disclosure, the masking layer for thinning could be manufactured easily. There is no surface scratch or subsurface damage on the surface of the optical element, and it is easy to remove the residual masking layer. This method has a good process repeatability and non-toxic and harmless, and is also suitable for traditional inorganic rigid materials such as silicon dioxide, silicon carbide and the like.

In order to realize the above purpose, the technical solution adopted by the present disclosure is as follows:

The present disclosure provides a method for figure correction of an optical element, wherein the method comprises:

a) forming a masking layer on a surface of the optical element, wherein the optical element has a thinning region and a non-thinning region, the masking layer is patterned to form a masking region and a non-masking region, and the masking layer is positioned relative to the optical element in such a manner that the masking region corresponds to the non-thinning regions of the optical element and the non-masking region corresponds to the thinning region of the optical element; and b) performing reactive ion etching on the optical element with the masking layer so as to etch the thinning region of the optical element to reduce a thickness of the thinning region.

According to at least one embodiment, the step of patterning the masking layer comprises:

measuring a wave-front map of the optical element;

reading values of x, y and z of all points in the wave-front map in a data processing software, wherein x and y are coordinates of X-axis and Y-axis of a point on the optical element, and z represents the figure error of the point;

selecting a threshold value z, the selected threshold value z satisfying a condition that $z_{min}+H_{thinning}<z<z_{max}-H_{thinning}$, wherein $z_{min}$ is a minimum value of z in a wave-front data, $z_{max}$ is a maximum value of z in a wave-front data, and $H_{thinning}$ is a thinning depth;

taking a line connecting all points that correspond to the selected threshold value of z as a boundary line between the thinning region and the non-thinning region;

determining a borderline between the masking region and the non-masking region of the masking layer according to the boundary line between the thinning region and the non-thinning region, and generating a pattern of the masking layer according to the determined border line between the masking region and the non-masking region According to at least one embodiment, the steps a) and b) are performed repeatedly until the optical element is figure-corrected to achieve a desired figure.

According to at least one embodiment, the method further comprises the step of aligning the optical element with the masking layer, wherein the step of aligning the optical element with the masking layer is realize by an aligning positioning mark on the optical element with an alignment mark on the masking layer.

According to at least one embodiment, the positioning mark on the optical element comprises a cross and a characteristic point.

According to at least one embodiment, the characteristic point comprises a high point, a low point and a defect point.

According to at least one embodiment, a surface of the optical element has a diffractive microstructure and/or a reflective layer.

According to at least one embodiment, the masking layer is made of a photoresist layer.

According to at least one embodiment, the masking layer is patterned by exposure and development process.

According to at least one embodiment, the masking layer is made of a flexible membrane.

According to at least one embodiment, the masking layer is patterned by membrane cutting process.

According to at least one embodiment, the masking layer is made of a rigid sheet.

According to at least one embodiment, a distance between the masking layer and the optical element is less than 0.5 mm when performing reactive ion etching.

According to at least one embodiment, the material of the optical element comprises polymeric material, inorganic material, and a metallic material.

According to at least one embodiment, the material of the optical element comprises polyimide, polyethylene terephthalate, silicon dioxide, silicon carbide, aluminum and copper.

According to another aspect of the present disclosure, a method for figure correction of optical element by reactive ion etching is provided, and the method comprises the following steps:

Step 1: fixing the optical element to be corrected 1 to a rigid frame 2;

Step 2: making positioning marks 3 on the optical element to be corrected 1, and measuring figure data of the optical element to be corrected 1 by an interferometer;

Step 3: changing the positions of the positioning marks 3 until the positioning marks 3 are completely located in a non-thinning region 4 or completely located in a thinning region 5;

Step 4: obtaining the values of x, y and z of the figure data in a figure measurement data analysis software, selecting a threshold value of z, and making a line connecting all the points corresponding to the threshold value of z as a boundary line between the thinning region 5 and the non-thinning region 4;

Step 5: manufacturing a masking layer 6 on the surface of the optical element to be corrected 1, and carrying out region division on the surface of the optical element to be corrected 1 based on distribution of the thinning region 5 and the non-thinning region 4 in the step 4, wherein, aligning with the positioning marks 3 on the optical element to be corrected 1 when the division is carried out, the thinning region 5 is not covered by the masking layer and the non-thinning region 4 is covered by the masking layer after the division is carried out;

Step 6: removing the positioning marks 3 made in the step 2;

Step 7: placing the optical element to be corrected 1 with the prepared masking layer 6 into a reactive ion etching apparatus, selecting appropriate etching gas and etching parameters, and thinning the thinning region 5;

Step 8: removing the masking layer 6 on the surface of the optical element to be corrected 1, and measuring the figure data of the optical element to be corrected 1; and Step 9: repeating step (b) to step (8) until the figure of the optical element to be corrected 1 meets usage requirements.

Further, the material of the optical element to be corrected 1 in step 1 comprises, but is not limited to, a flexible optical membrane such as polyimide, polyethylene terephthalate, and the like, and a rigid optical substrate such as silica, silicon carbide, and the like.

Further, a surface of the optical element to be corrected 1 in step 1 can be provided with diffractive microstructures or reflective layers.

Further, the figure data of the optical element to be corrected 1 in step 2 is a transmitted wave-front error or a reflected wave-front error, which includes shape, size and position information of the positioning marks 3.

Further, the number of the positioning marks 3 in the step 2 is not less than three, and a distance between any two of the positioning marks is not less than the radius of the optical element to be corrected 1.

Further, the value of z in step 4 should satisfy $z_{min}$ $H_{thinning} < z < z_{max} - H_{thinning}$, where $z_{min}$ is the minimum value of z in the wave-front data, $z_{max}$ is the maximum value of z in the wave-front data, and $H_{thinning}$ is the thinning depth.

Further, the alignment in step 5 includes, but is not limited to, the alignment by naked eyes and the alignment by a microscope.

Further, the masking layer 6 in step 5 can tightly cover the surface of the optical element to be corrected 1, or can suspend on the surface thereof at a distance within 0.5 mm, and the material of the masking layer 6 includes, but is not limited to, a photoresist, a flexible membrane, and a specially-made masking plate.

Further, the method of the division in step 5 includes, but is not limited to, ultraviolet light development, membrane cutting, and designing and processing of masking plate.

Further, as to the thinning in the step 7, the thinning depth satisfies the following relation:

$$H_{thinning} < \frac{v_{substrate}}{v_{masking}} \times H_{masking},$$

wherein $H_{thinning}$ is a thinning depth, $v_{masking}$ is the etching rate of the masking layer 6, $v_{substrate}$ is the etching rate of the surface of the optical element to be corrected 1, and $v_{masking}$ is the thickness of the masking layer 6.

BRIEF DESCRIPTION OF THE DRAWINGS

FIG. 1a-FIG. 1h shows a flow chart of the optical element figure correction method based on reactive ion etching thinning according to the present disclosure, wherein FIG. 1a is a schematic diagram of a sample preparation process step, FIG. 1b is a schematic diagram of the process steps of making positioning marks and measuring the figure of the optical element, FIG. 1c is a schematic diagram of positioning marks before their positions are modified, FIG. 1d is a schematic diagram of positioning marks after their positions are modified, FIG. 1e is a schematic diagram of the process steps of manufacturing a masking layer and dividing the surface of the optical element into the thinning region and the non-thinning region, FIG. if is a schematic diagram of a process step of removing positioning marks, FIG. 1g is a schematic diagram of a reactive ion etching thinning process step, and FIG. 1h is a schematic diagram of the steps of removing a residual masking layer and measuring the figure of the optical element;

Wherein: 1—optical element to be corrected; 2—rigid frame; 3—positioning mark; 4—non-thinning region; 5—thinning region; 6—masking layer; 7—limiting column.

DETAILED DESCRIPTION OF THE PREFERRED EMBODIMENT

The present disclosure is described in detail below with reference to the drawings and embodiments.

Embodiment 1

In this embodiment, the principle and the process steps of the method for figure correction of the optical element based on the reactive ion etching thinning are described in detail with reference to FIGS. 1a-1h, which illustrate schematically the method for figure correction of the optical element by the reactive ion etching thinning. In this embodiment, the method is used to figure the transmitted wave-front error of a 400 mm aperture polyimide membrane element.

Some process parameters for the optical membrane element in the embodiment are set as follows: the optical element to be corrected 1 is a polyimide membrane with a thickness of 25 microns; a rigid frame 2 is made of stainless steel; the aperture of the optical element is 400 mm; for the initial transmitted wave-front error for the 400 mm aperture, PV (Peak-Valley) is larger than 0.951 wavelength and rms (root mean square) is larger than 0.166 wavelength; the photoresist for forming a masking layer is AZ1500 and the spin-coated thickness of the photoresist is 500 nanometers; the gas for reactive ion etching thinning comprises oxygen and trifluoromethane, which are under a flow ratio of 10:1; the etching power is 1500 W, the etching pressure in the cavity is 3.0 Pa; and the etching apparatus is single-frequency capacitively coupled reactive ion etching apparatus.

Figure 1A:
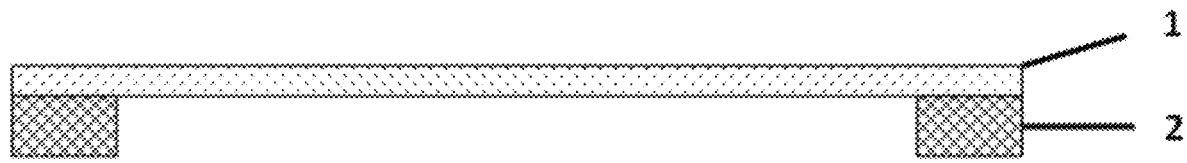
Figure 1B:
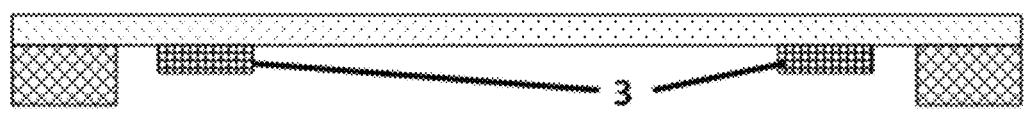
Figure 1C:
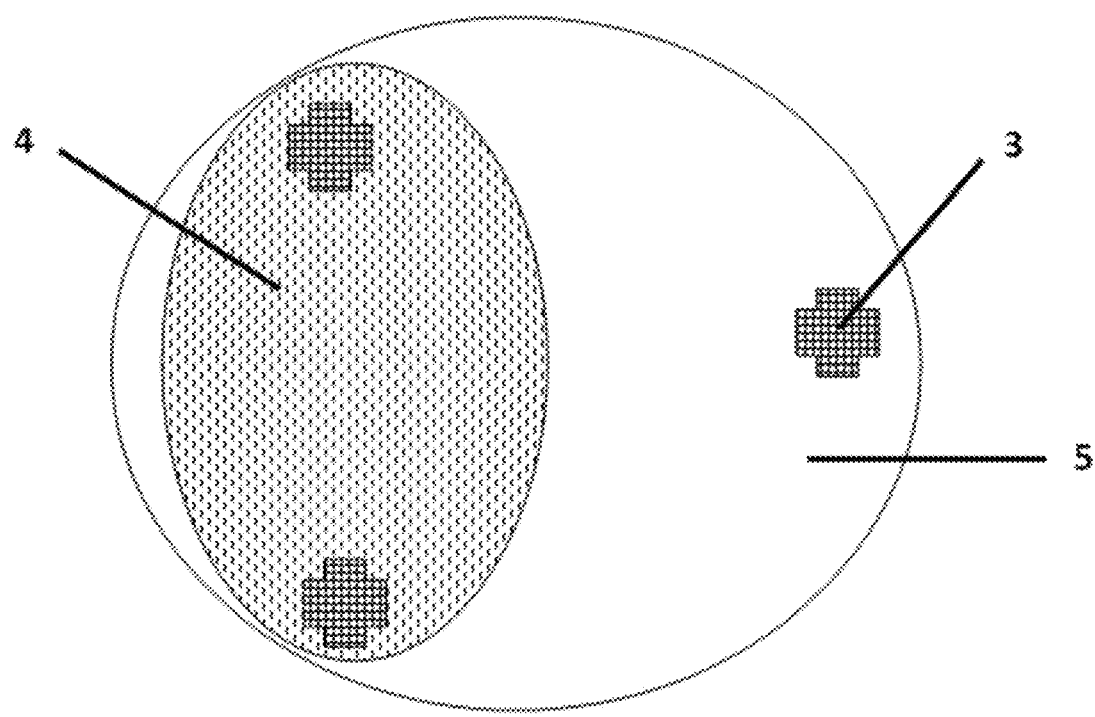
Figure 1D:
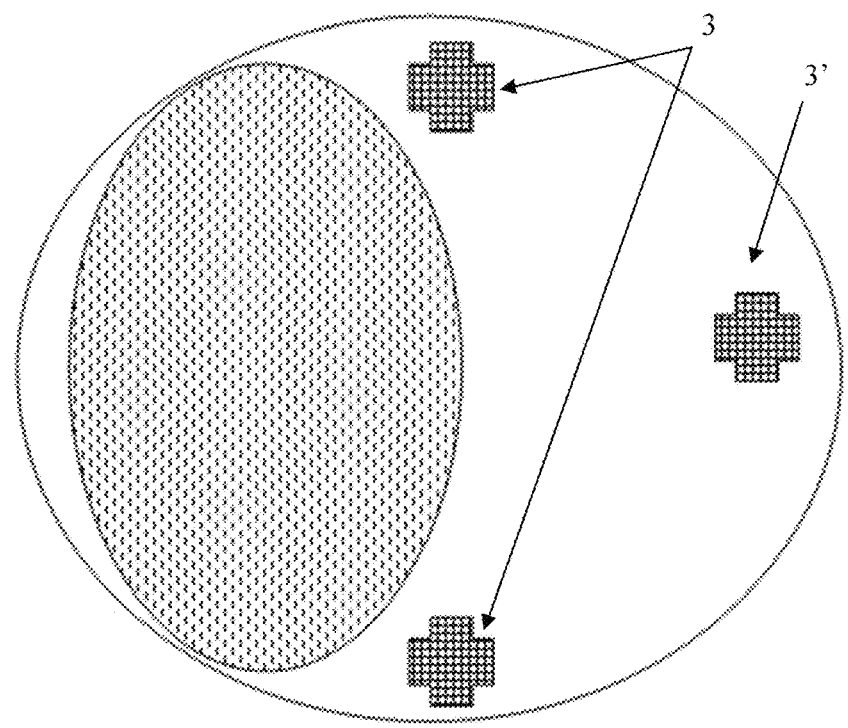
Figure 1E:
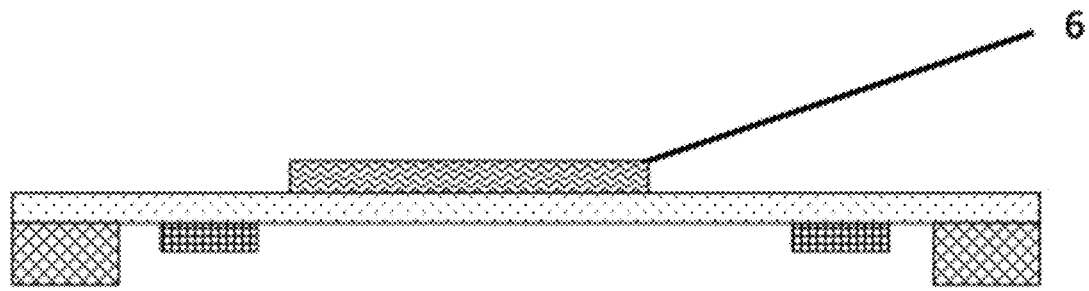
Figure 1F:
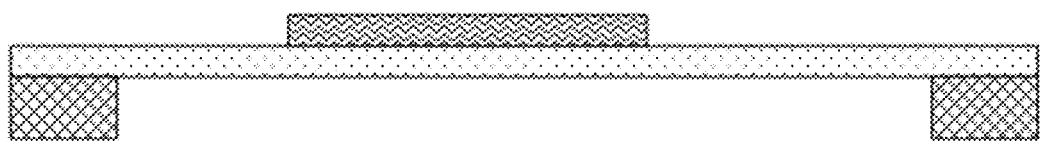
Figure 1G:
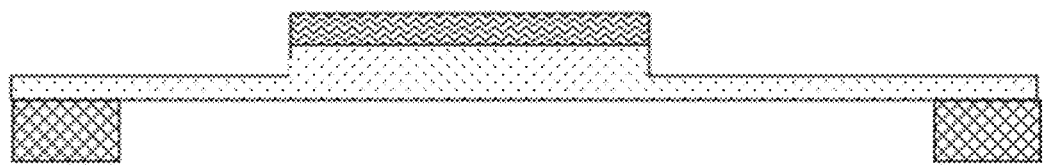
Figure 1H:
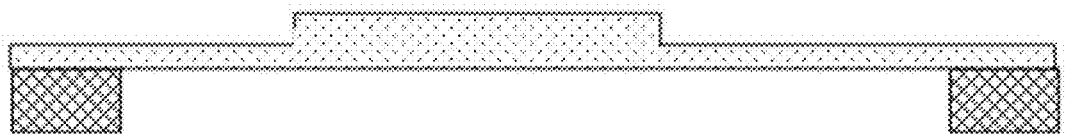
Figure 2A:
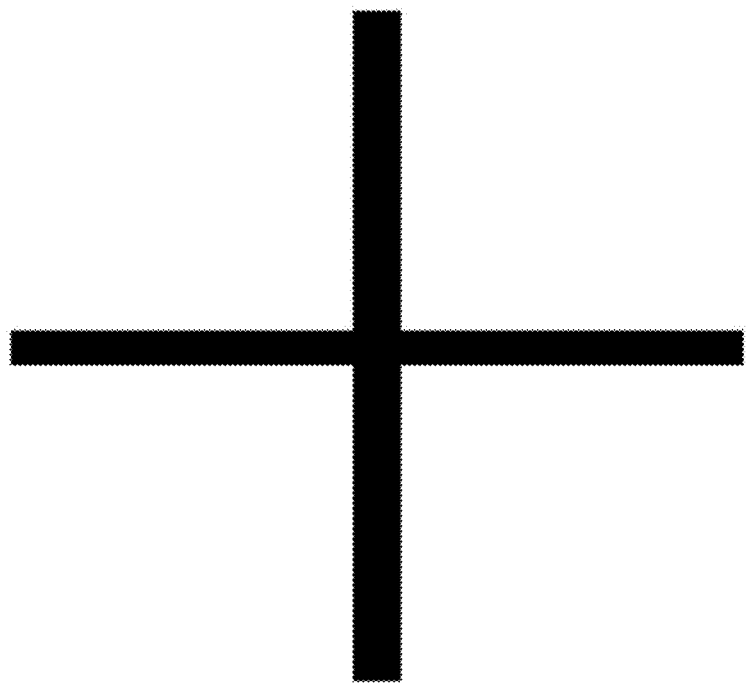
FIG. 2a-FIG. 2b illustrate the schematic diagram of the positioning mark; and the schematic diagram of the alignment mark (the black portion represent the opaque portion), respectively.
Figure 2B:
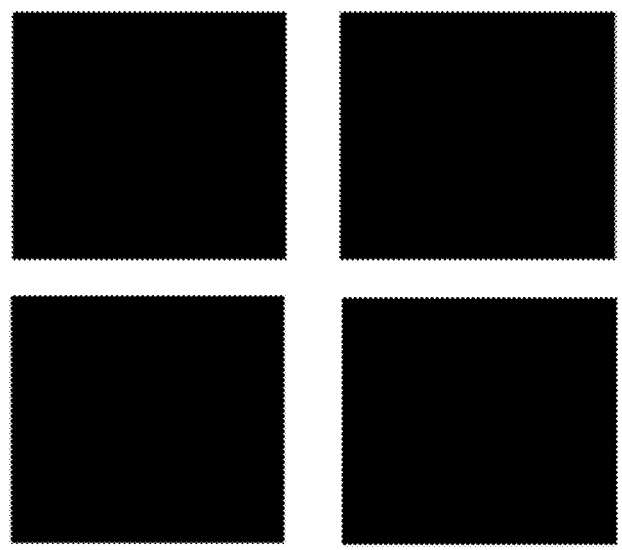
Figure 3A:
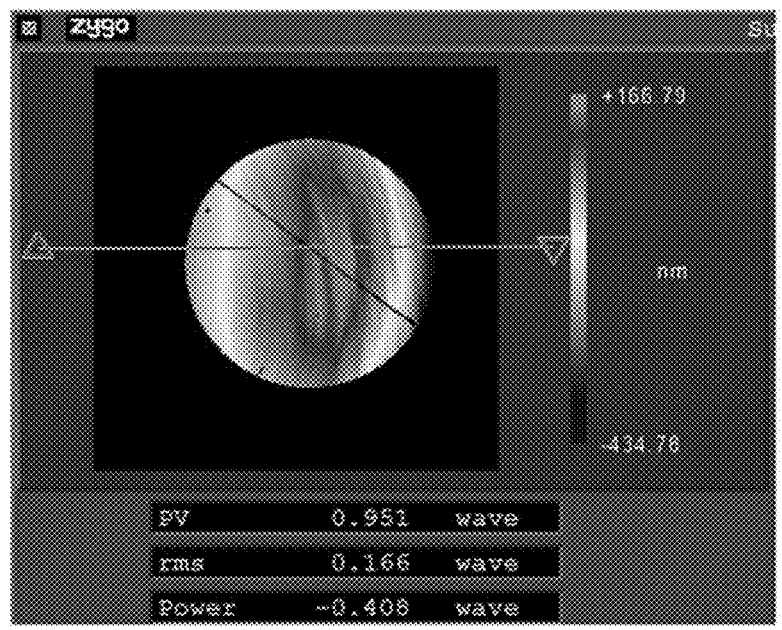
FIG. 3a-FIG. 3b show the transmitted wave-front data before (FIG. 3a) and after (FIG. 3b) correcting the figure of the membrane substrate of the optical element with a diameter of 400 mm in embodiment 1.
Figure 3B:
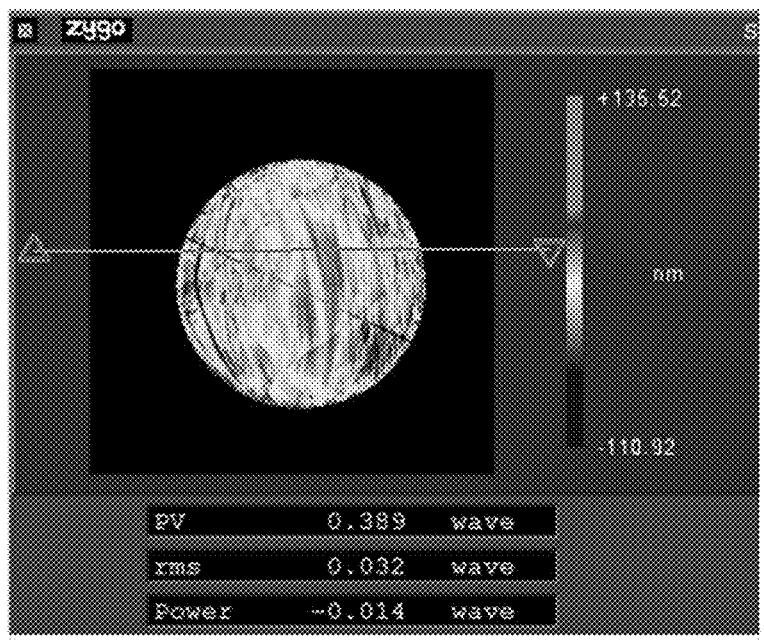
Figure 4A:
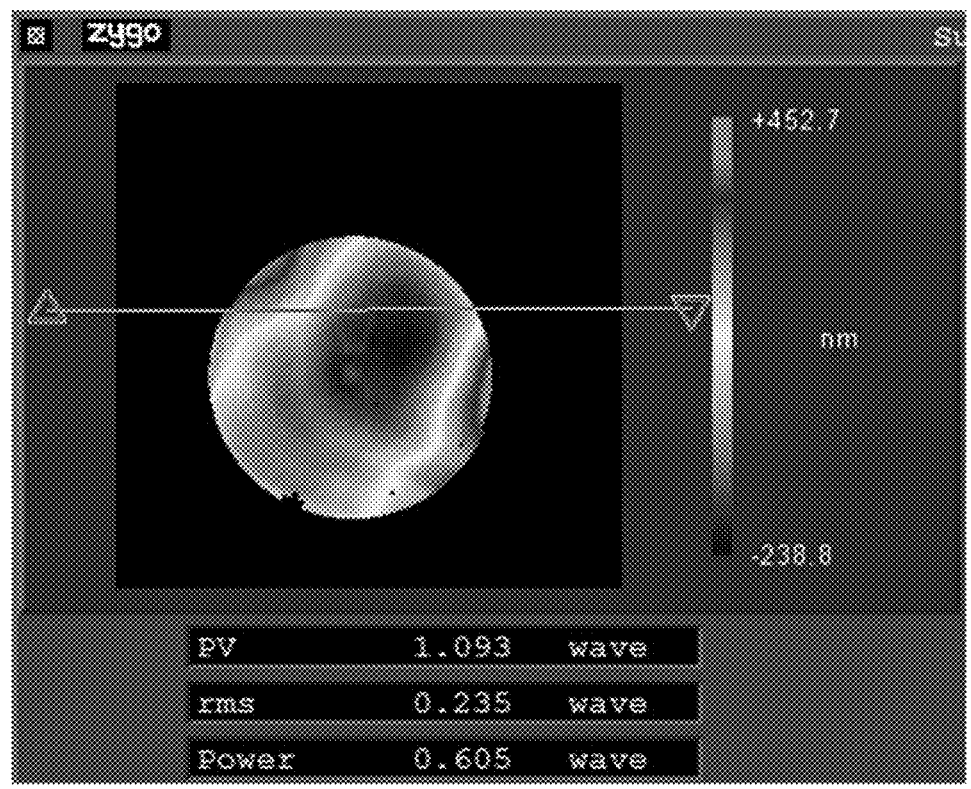
FIG. 4a-FIG. 4b shows the reflected wave-front data before and after correcting the figure of a quartz substrate of the optical element with a diameter of 390 mm in embodiment 2.
Figure 4B:
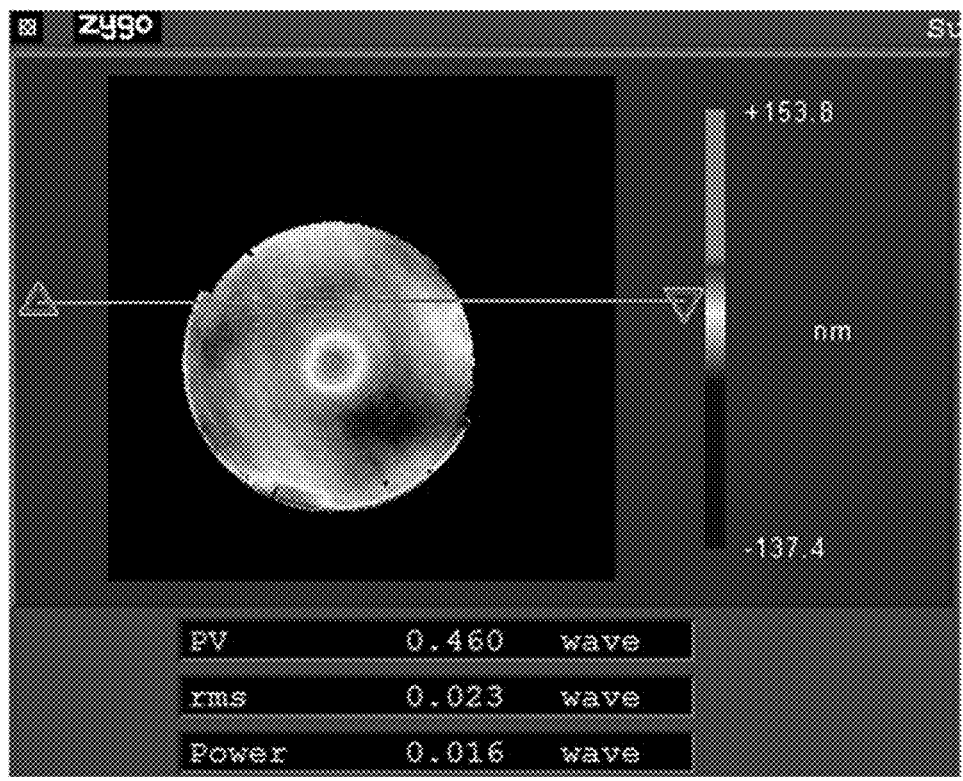

The method for figure correction of optical element according to this embodiment comprises the following steps:

Step 1: The optical element to be corrected 1 is fixed on the rigid frame 2, which is provided with a clamping device. The clamping device may fix the optical element to be corrected 1 with the assistance of optical adhesive so that a horizontal displacement of the optical element to be corrected 1 with respect to the frame 2 can be prevented;

Step 2: The first positioning marks 3 are printed on a transparent PET membrane. The first positioning mark 3 is a cross as shown in FIG. 2a. The line width of the cross is 2.5 mm, and the line length of the cross is 4 mm. the PET membrane with the first positioning marks 3 is cut into the size of 5 mm×5 mm, which are then adhered on a transparent adhesive tape with the size of 2 mm×10 mm. Then the PET membrane is fixed at the edge of the backside of the optical element to be corrected 1. The total number of the first positioning marks 3 is three, and the distance between any two of the first positioning marks 3 is not less than 200 mm;

Step 3: The transmitted wave-front map of the optical element to be corrected 1 is measured by an interferometer. There is no data in the region of the first positioning marks 3 in the transmitted wave-front map due to opacity of the first positioning marks 3. The profile of the data-free region is the profile of the first positioning marks 3. The relative positions of the three first positioning marks 3 are determined according to the transmitted wave-front map formed by the transmitted wave-front data. If the three first positioning marks 3 are all located in the thinning region 5 or all located in the non-thinning region 4, then the method proceeds with step 4. If at least one of the three first positioning marks 3 is located in the thinning region 5 while at least another one of the three first positioning marks 3 is located in the non-thinning region 4, it is needed to determine a position for new positioning marks, i.e., the second positioning marks 3'. The position of the second positioning marks 3' is selected such that all the second positioning marks 3' will be located in the thinning region 5. Then the second positioning marks 3' are fixed on the backside of the optical element to be corrected 1 by the same process as the process for fixing the first positioning marks 3 as descripted in the step 2. Then the first positioning marks 3 which are not located in the thinning region 5 are removed. The transmitted wave-front data of the optical element to be corrected 1 are measured again and formed into a transmitted wave-front map, by which it may be confirmed that the first positioning marks 3 or the second positioning marks 3' are all located in the thinning region 5. That is, it can be ensured that all the positioning marks are located completely within the thinning region 5 or completely within the non-thinning region 4 through this step 3; Step 4: The x, y and z values of the figure data, which are measured by the interferometer, are obtained through figure data analysis software. The x and y represent the coordinates of a point of the optical element 1 on X-axis and Y-axis, respectively, and z represents the figure error of this point. A threshold value of z is selected and this threshold value of z meets the following conditions: $z_{min}+H_{thinning}<z<z_{max}-H_{thining}$, wherein $z_{min}$ is the minimum value of z in the wave front data, $z_{max}$ is the maximum value of z in the wave front data, and $H_{thinning}$ is the thinning depth. In this embodiment, $H_{thinning} \le 50$ nm. A line connecting all points that correspond to the selected threshold value of z forms a boundary line between the thinning region 5 and the non-thinning region 4. The region involving the points with a value of z smaller than the selected threshold value of z is the thinning region 5, and the region involving the points with a value of z larger than the selected threshold value of z is the non-thinning region 4. The distribution of the thinning region 5 and the non-thinning region 4 is transferred into a distribution of light-transmitting regions and non-light-transmitting regions on the photolithography mask. The thinning region 5 corresponds to the light-transmitting region on the photolithography mask, and the non-thinning region 4 corresponds to the non-light-transmitting region on the photolithography mask, based on which the photolithography mask is manufactured;

Step 5: A photoresist layer is uniformly spin-coated on the surface of the optical element to be corrected 1, and then the photoresist layer is exposed using the photolithography mask made in the step 4. The exposure time is 30 seconds, the wavelength of the light source is 365 nm, and the exposure energy is 4 mJ/cm$^2$. Before the exposure, the photolithography mask is aligned to the optical element to be corrected 1 through superposing the alignment marks on the photolithography mask with the corresponding first positioning marks 3 and the corresponding second positioning marks 3' on the optical element to be corrected 1 respectively, for example, using naked eyes or microscope. The black crosses of the first positioning mark 3 and the second positioning mark 3' are just superposed with the white crosses of the alignment marks on the photolithography mask;

Step 6: The exposed optical element to be corrected 1 is developed with a developing solution of 300 MIF for 30s. The photoresist in the thinning region 5 is removed while the photoresist in the non-thinning region 4 is reserved. Due to the shielding effect of the first positioning mark 3 and the second positioning mark 3', the photoresist in the regions corresponding to the first positioning mark 3 and the second positioning mark 3' is not exposed and thus is reserved;

Step 7: The regions corresponding to the first positioning mark 3 and the second positioning mark 3' is found out by means of a microscope. The regions corresponding to the first positioning mark 3 and the second positioning mark 3' on the surface of the optical element to be corrected 1 are wiped by a cotton swab dipped with acetone until the photoresist therein is removed completely. Now there is no photoresist in the whole thinning region 5. Then the first positioning mark 3 and the second positioning mark 3' on the back surface of the optical element to be corrected 1 are removed;

Step 8: The optical element to be corrected 1 provided with the masking layer (namely, the photoresist layer) is placed into a reactive ion etching apparatus to thin the optical element to be corrected 1 based on the aforementioned etching parameters. The thinning depth and the thickness of the photoresist layer satisfy the following formula:

$$H_{thinning} < \frac{v_{substrate}}{v_{masking}} \times H_{masking}.$$

The thickness of the thinning region 5 is reduced, and the thickness of the non-thinning region 4 is not changed due to the shielding of the photoresist layer;

Step 9: The residual photoresist on the surface of the optical element to be corrected 1 is removed by acetone. After being dried by nitrogen, the optical element to be corrected 1 is measured to obtain the transmitted wave-front data; and Step 10: The step 2 to the step 9 are repeated until the transmitted wave-front data PV of the optical element to be corrected 1 is less than 250 nm and the RMS is less than 20 nm.

Embodiment 2: In this embodiment, the principle and the process steps of the method for figure correction of the optical element based on the reactive ion etching thinning are described in detail with reference to FIGS. 1a-1h which illustrate schematically the method for figure correction of the optical element by the reactive ion etching thinning. In this embodiment, the method is used to figure the reflected wave-front error of a 390 mm aperture quartz element.

Some process parameters for the optical quartz element in the embodiment are set as follows: the optical element to be corrected 1 is a quartz plate with a thickness of 13 mm; a rigid frame 2 is made of stainless steel; the aperture of the optical element 1 is 390 mm; for the initial reflected wave-front error for the 390 mm aperture, PV (Peak-Valley) is larger than 1.093 wavelength and rms (root mean square) is larger than 0.235 wavelength; the gas for reactive ion etching thinning comprises oxygen and trifluoromethane, which are under a flow ratio of 1:5; the etching power is 1300 W, the etching pressure in the cavity is 2.0 Pa; and the etching apparatus is single-frequency capacitively coupled reactive ion etching apparatus.

Figure 5:
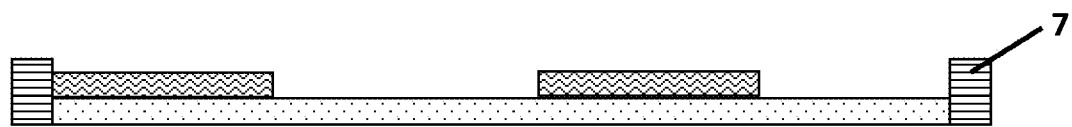
FIG. 5 is a schematic view illustrating installation of a masking assembly in embodiment 2.

The method for figure correction of optical element according to this embodiment comprises the following steps:

Step 1: The optical element to be corrected 1 is fixed on the rigid frame 2, which is provided with a clamping device. The clamping device may fix the optical element to be corrected 1 with the assistance of optical adhesive so that a horizontal displacement of the optical element to be corrected 1 with respect to the frame 2 can be prevented;

Step 2: The first positioning marks 3 are drawn by a black marking pen to the edge of the front surface of the optical element to be corrected 1. The total number of the first positioning marks 3 is three, and the distance between any two of the first positioning marks 3 is not less than 200 mm;

Step 3: The reflected wave-front map of the optical element to be corrected 1 is measured by an interferometer. There is no data in the region of the first positioning marks 3 in the reflected wave-front map due to the different light reflectivity of the first positioning marks 3. The profile of the data-free region is the profile of the first positioning marks 3. The relative positions of the three first positioning marks 3 are determined according to the reflected wave-front map formed by the reflected wave-front data. If the three first positioning marks 3 are all located in the thinning region 5 or all located in the non-thinning region 4, then the method proceeds with step 4. If at least one of the three first positioning marks 3 is located in the thinning region 5 while at least another one of the three first positioning marks 3 is located in the non-thinning region 4, it is needed to determine a position for new positioning marks, i.e., the second positioning marks 3'. The position of the second positioning marks 3' is selected such that all the second positioning marks 3' will be located in the non-thinning region 4. Then the second positioning marks 3' are drawn on the front surface of the optical element to be corrected 1 by the same process as the process for drawing the first positioning marks 3 as descripted in the step 2. Then the first positioning marks 3 which are not located in the non-thinning region 4 are removed. The reflected wave-front data of the optical element to be corrected 1 are measured again and formed into a reflected wave-front map, by which it may be confirmed that the first positioning marks 3 or the second positioning marks 3' are all located in the non-thinning region 4. That is, it can be ensured that all the positioning marks are located completely within the thinning region 5 or completely within the non-thinning region 4 through this step 3;

Step 4: The x, y and z values of the figure data, which are measured by the interferometer, are obtained through figure data analysis software. The x and y represent the coordinates of a point of the optical element 1 on X-axis and Y-axis, respectively, and z represents the figure error of this point. A threshold value of z is selected and this threshold value of z meets the following conditions: $z_{min}+H_{thinning}<z<z_{max}-H_{thinning}$, wherein $z_{min}$ is the minimum value of z in the wave front data, $z_{max}$ is the maximum value of z in the wave front data, and $H_{thinning}$ is the thinning depth. In this embodiment, $H_{thinning} \leq 50$ nm. A line connecting all points that correspond to the selected threshold value of z forms a boundary line between the thinning region 5 and the non-thinning region 4. The region involving the points with a value of z larger than the selected threshold value of z is the thinning region 5, and the region involving the points with a value of z smaller than the selected threshold value of z is the non-thinning region 4. The distribution of the thinning region 5 and the non-thinning region 4 is transferred into a distribution of non-masking regions and masking regions on a masking plate. The thinning region 5 corresponds to the non-masking region in the masking plate, and the non-thinning region 4 corresponds to the masking region on the masking plate, based on which a masking plate is manufactured;

Step 5: A masking assembly is mounted above the optical element to be corrected 1. As shown in FIG. 5, the masking assembly comprises a limiting mounting part and the masking plate manufactured in the step 4. The limiting column 7 is integrated on a stainless steel ring to form the limiting mounting part. The inner diameter of the ring is just larger than the outer diameter of the optical element to be corrected 1. Firstly the limiting column is mounted on the outer side of the optical element to be corrected 1, and then the masking plate prepared in the step 4 is mounted on the limiting column. The alignment marks on the masking plate are aligned with the corresponding first positioning marks 3 and the corresponding second positioning marks 3' on the optical element to be corrected 1 respectively, for example, using naked eyes, by the following steps: the direction of the masking plate is adjusted until the plurality of alignment marks on the masking plate are superposed with the corresponding first positioning marks 3 and the second positioning marks 3' on the optical element to be corrected 1. After alignment, the height and levelness of the masking plate are adjusted until the distance between the lower surface of the masking plate and the upper surface of the optical element to be corrected 1 is less than 0.5 mm;

Step 6: The optical element to be corrected 1 which is provided with the masking plate is placed into the reactive ion etching apparatus to thin the optical element to be corrected 1 based on the aforementioned etching parameters. The thinning depth and the thickness of the masking region satisfy the following formula:

$$H_{thinning} < \frac{v_{substrate}}{v_{masking}} \times H_{masking}.$$

The thickness of the thinning region 5 is reduced, and the thickness of the non-thinning region 4 is not changed due to the shielding of the masking region;

Step 7: The masking assembly is removed, and the reflected wave-front data of the optical element to be corrected 1 is measured; and Step 8: The step 2 to the step 7 are repeated until the reflected wave-front data PV of the optical element to be corrected 1 is less than 300 nm and the RMS is less than 15 nm.

In the correction method provided by the present disclosure, the positioning marks on the optical element are not limited to the cross described in the above embodiment, and characteristic points reflecting the surface shape or figure of the optical element, including but not limited to high points, low points, defect points and the like, can also be used.

The correction method provided by the present disclosure can be applied for optical elements with any surface shapes (figure), including but not limited to optical elements with diffraction microstructures and reflecting layers.

The plasmas used for the reactive ion etching includes, but is not limited to, capacitively coupled plasmas, inductively coupled plasmas, transformer coupled plasmas, and electron cyclotron resonance plasmas.

The material forming the optical element includes, but is not limited to, polymer materials such as polyimide and polyethylene terephthalate, inorganic materials such as silicon dioxide and silicon carbide, and metal materials such as aluminum and copper.

The present disclosure may realize the following beneficial effects:

(a) The removal of the surface material of the optical element mainly depends on parallel large-area dry chemical reaction etching. The removal process is not affected by the physical properties and physical state of the substrate. The removal rate is much higher than the single-point serial physical removal method. The removal accuracy can reach nanometers level, which is better than traditional processes such as cutting and grinding. The method in the present disclosure greatly improves the processing efficiency. The temperature of the substrate surface is not high during the entire removal process, and the optical performance of the optical element is not affected, which solves the technical problem that the existing rigid optical substrate polishing technology cannot be directly applied to the flexible membrane optical substrate polishing.

(b) For the protection of the non-thinning regions, a photoresist masking layer can be used. The masking layer may be spin-coated easily and uniformly. No surface scratches or subsurface damage would be caused on the substrate. The surface finish of the optical element would not be affected. The division between the thinning region and the non-thinning region can be realized based on the lithography micromachining method. The boundary contour positioning accuracy is high, and the photoresist masking layer can be easily removed. The simple solvent immersion and cleaning can remove the residual masking layer, and will not leave marks on the surface of the optical element.

(3) The positioning of the measured wave-front map and the actual thinning region can adopt a microscope alignment method. The alignment precision can reach the micron level. The high precision positioning alignment reduces the figure correction iteration times, and thus the processing efficiency is improved.

(4) The figure correction process of the optical element is based on the reactive ion etching process and the photolithography process, which are usual processes in the field of semiconductor manufacture, and thus is stable in terms of performance and may apply to various plane and small-vector high curved surface optical element substrates. The figure correction of an optical element formed by traditional materials such as silicon dioxide, silicon carbide, even ceramics, metal materials and the like can be completely realized by selecting corresponding appropriate etching gas.

It is to be understood that the above examples are illustrative only for the purpose of clarity and are not intended to limit the present disclosure. Other variations and modifications will be apparent to those people skilled in the art in light of the above description. This need not be, nor should it be exhaustive of all embodiments. And obvious variations or modifications of the invention may be made without departing from the scope of the invention.

What is claimed is:

1. A method for figure correction of an optical element, wherein the method comprises:
    a) forming a masking layer on a surface of the optical element, wherein the optical element has a thinning region and a non-thinning region, the masking layer is patterned to form a masking region and a non-masking region, and the masking layer is positioned relative to the optical element in such a manner that the masking region corresponds to the non-thinning regions of the optical element and the non-masking region corresponds to the thinning region of the optical element;
    b) performing reactive ion etching on the optical element with the masking layer so as to etch the thinning region of the optical element to reduce a thickness of the thinning region; and
    c) aligning the optical element with the masking layer, wherein said aligning of the optical element with the masking layer is realized by an aligning positioning mark on the optical element with an alignment mark on the masking layer.

2. A method for figure correction of an optical element, wherein the method comprises:
    a) forming a masking layer on a surface of the optical element, wherein the optical element has a thinning region and a non-thinning region, the masking layer is patterned to form a masking region and a non-masking region, and the masking layer is positioned relative to the optical element in such a manner that the masking region corresponds to the non-thinning regions of the optical element and the non-masking region corresponds to the thinning region of the optical element; and
    b) performing reactive ion etching on the optical element with the masking layer so as to etch the thinning region of the optical element to reduce a thickness of the thinning region,
wherein the masking layer is patterned by a method that comprises:

measuring a wave-front map of the optical element;
   reading values of x, y and z of all points in the wave-front map in a data processing software, wherein x and y are coordinates of X-axis and Y-axis of a point on the optical element, and z represents the figure error of the point;
   selecting a threshold value z, the selected threshold value z satisfying a condition that $Z_{min}+H_{thinning}<Z<Z_{max}-H_{thinning}$, wherein $z_{min}$ is a minimum value of z in a wave-front data, $z_{max}$ is a maximum value of z in a wave-front data, and $H_{thinning}$ is a thinning depth;
   taking a line connecting all points that correspond to the selected threshold value of z as a boundary line between the thinning region and the non-thinning region;
   determining a borderline between the masking region and the non-masking region of the masking layer according to the boundary line between the thinning region and the non-thinning region, and generating a pattern of the masking layer according to the determined border line between the masking region and the non-masking region.

3. The method of claim 1, wherein said a) and b) are performed repeatedly until the optical element is figure-corrected to achieve a desired figure.

4. The method according to claim 1 the positioning mark on the optical element comprises a cross and a characteristic point.

5. The method of claim 4, wherein the characteristic point comprises a high point, a low point and a defect point.

6. The method of claim 1, wherein a surface of the optical element has a diffractive microstructure and/or a reflective layer.

7. The method of claim 1, wherein the masking layer is made of a photoresist layer.

8. The method of claim 7, wherein the masking layer is patterned by exposure and development process.

9. The method of claim 1, wherein the masking layer is made of a flexible membrane.

10. The method of claim 9, wherein the masking layer is patterned by membrane cutting process.

11. The method of claim 1, wherein the masking layer is made of a rigid sheet.

12. The method of claim 1, wherein a distance between the masking layer and the optical element is less than 0.5 mm when performing reactive ion etching.

13. The method of claim 1, wherein the material of the optical element comprises polymeric material, inorganic material, and a metallic material.

14. The method of claim 1, wherein the material of the optical element comprises polyimide, polyethylene terephthalate, silicon dioxide, silicon carbide, aluminum and copper.

* * * * *